(12) United States Patent
Cheyns

(10) Patent No.: US 10,468,599 B2
(45) Date of Patent: Nov. 5, 2019

(54) PATTERNED ORGANIC SEMICONDUCTOR LAYERS

(71) Applicant: IMEC vzw, Leuven (BE)

(72) Inventor: David Cheyns, Mechelen (BE)

(73) Assignee: IMEC vzw, Leuven (BE)

( * ) Notice: Subject to any disclaimer, the term of this patent is extended or adjusted under 35 U.S.C. 154(b) by 504 days.

(21) Appl. No.: 14/328,084

(22) Filed: Jul. 10, 2014

(65) Prior Publication Data

US 2014/0338728 A1    Nov. 20, 2014

Related U.S. Application Data

(63) Continuation of application No. PCT/EP2012/076529, filed on Dec. 20, 2012.

(Continued)

(51) Int. Cl.
| | |
|---|---|
| *H01L 51/56* | (2006.01) |
| *H01L 27/32* | (2006.01) |
| *H01L 51/00* | (2006.01) |
| *H01L 51/44* | (2006.01) |
| *H01L 51/52* | (2006.01) |
| *H01L 51/42* | (2006.01) |

(52) U.S. Cl.
CPC ......... *H01L 51/0014* (2013.01); *H01L 27/32* (2013.01); *H01L 27/3204* (2013.01); *H01L 51/42* (2013.01); *H01L 51/44* (2013.01); *H01L 51/52* (2013.01); *H01L 51/56* (2013.01); *H01L 2251/566* (2013.01); *Y02E 10/549* (2013.01)

(58) Field of Classification Search
CPC ...... H01L 51/0014; H01L 51/56; H01L 27/32
See application file for complete search history.

(56) References Cited

U.S. PATENT DOCUMENTS 6,828,582 B1 * 12/2004 Ando ................ B82Y 10/00
                                                    257/350
6,887,332 B1    5/2005 Kagan et al.
(Continued)

FOREIGN PATENT DOCUMENTS

| JP | 2008-073911 A | | 4/2008 | |
|---|---|---|---|---|
| WO | WO 2010/038356 | * | 4/2010 | ............. H01B 33/12 |
| WO | WO 2011-051234 A1 | | 5/2011 | |

OTHER PUBLICATIONS

Bedis, Effect of Self-Assembled Monolayers on the Performance of Organic Photovoltaic Cells, *Journal of Surface Engineered Materials and Advanced Technology*, 2011, vol. 1, p. 42-50.

(Continued)

*Primary Examiner* — Tae-Sik Kang
(74) *Attorney, Agent, or Firm* — Knobbe, Martens, Olson & Bear LLP

(57) ABSTRACT

A method of patterning organic semiconductor layers is disclosed. In one aspect, a method for forming a patterned organic semiconductor layer on a substrate includes providing a plurality of first electrodes on a substrate. The method additionally includes providing a patterned self-assembling monolayer at predetermined locations on each of the plurality of first electrodes. The method further includes providing a layer comprising an organic semiconductor material over the patterned self-assembling monolayer. A corresponding device and a photovoltaic module comprising such a device are also disclosed.

18 Claims, 8 Drawing Sheets

Related U.S. Application Data

(60) Provisional application No. 61/585,538, filed on Jan. 11, 2012.

(56) References Cited

U.S. PATENT DOCUMENTS

| | | | |
|---|---|---|---|
| 2005/0025880 A1 | 2/2005 | Masuda | |
| 2007/0105396 A1* | 5/2007 | Li | B82Y 10/00 438/758 |
| 2009/0155723 A1* | 6/2009 | Lang | G03F 7/0007 430/311 |
| 2011/0156079 A1* | 6/2011 | Nakatani | H01L 51/0004 257/98 |

OTHER PUBLICATIONS

Era et al., "Organic-Inorganic Heterostructure Electroluminescent Device Using a Layered Perovskite Semiconductor $(C_6H_5C_2H_4NH_3)_2PbI_4$," *Applied Physics Letters*, vol. 65, Aug. 8, 1994, pp. 676-678.

Girotto et al., "High-Performance Organic Solar Cells with spray-Coated Hole-Transport and Active Layers," *Adv. Funct. Mater.*, 2011, vol. 21, p. 64-72.

International Search Report dated Apr. 2, 2013 in PCT Application No. PCT/EP2012/076529.

* cited by examiner

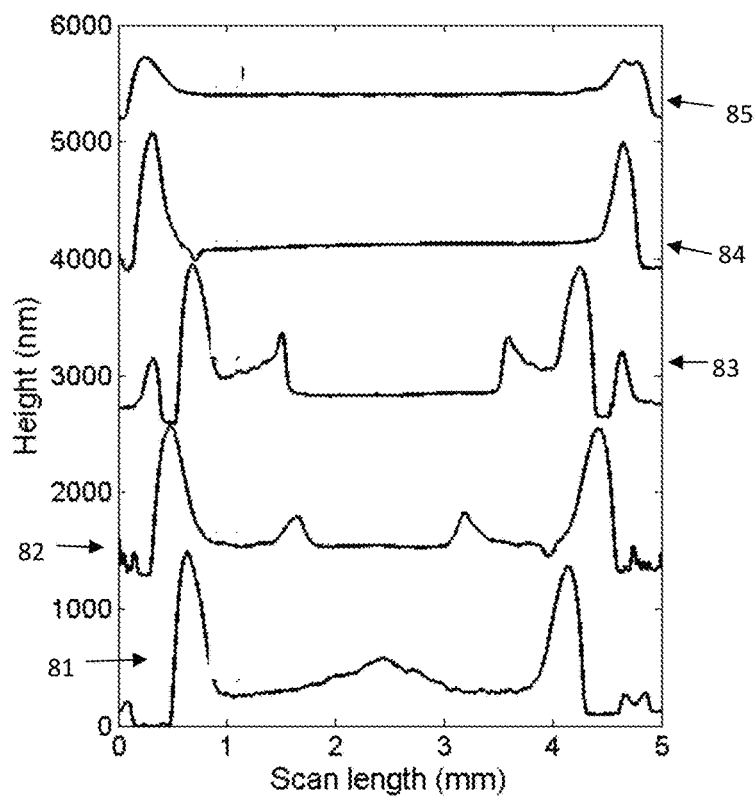
FIG. 14
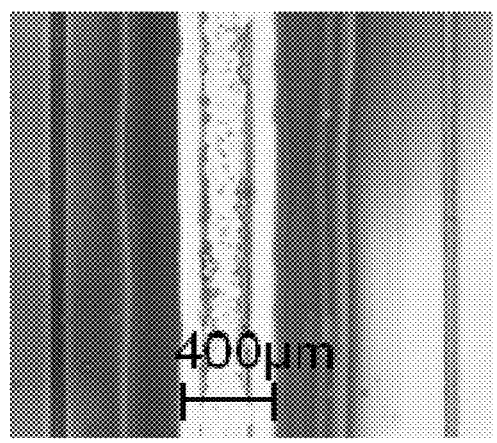 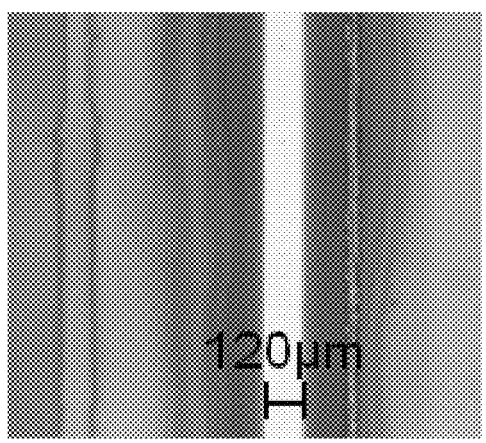
FIG. 15　　　　　FIG. 16

PATTERNED ORGANIC SEMICONDUCTOR LAYERS

CROSS-REFERENCE TO RELATED APPLICATIONS

This application is a continuation of PCT application PCT/EP2012/076529, filed on Dec. 20, 2012, which claims priority under 35 U.S.C. § 119(e) to U.S. provisional patent application 61/585,538, filed on Jan. 11, 2012. Each of the above applications is incorporated herein by reference in its entirety.

BACKGROUND OF THE INVENTION

Field of the Invention

The disclosed technology relates generally to patterning organic semiconductor layers, and more particularly to patterning organic semiconductor layers on a substrate, e.g., for fabricating organic photovoltaic modules with monolithically integrated photovoltaic cells.

Description of the Related Technology

Organic photovoltaic cells (OPV), e.g. photovoltaic cells fabricated via solution processing of organic inks such as polymer:fullerene inks, may provide high efficiencies while also providing relatively easy and low cost integration for diverse applications and large scale production. While small area cells can attain good power conversion efficiencies, larger area polymer devices sometimes suffer from efficiency-limiting losses. For example, efficiencies of larger devices may be limited due to low electrical conductivity of the transparent contact.

Low conductivity of the transparent electrodes may limit physical dimensions of individual organic photovoltaic cells. To mitigate the effects of the low conductivity of the transparent electrodes, several organic photovoltaic cells are sometimes connected in series to form a single module. In view of limiting the non-active zone between adjacent cells, it may be advantageous to provide monolithic integration of the cells on a single substrate.

The series connection of adjacent cells on a substrate using traditional methods are sometimes achieved by providing an unpatterned organic photoactive layer on a substrate comprising pre-patterned electrodes, followed by local removal of the organic photoactive layer in a subsequent process to define the individual cells. In this way, the limited conductivity of the transparent contact can be mitigated by combining several smaller cells in a series-connected chain. This approach can limit the produced photocurrent of the overall module, while increasing the voltage linearly with the number of cells connected in series.

The processing of these monolithically connected organic modules often includes patterning of each deposited layer in order to connect the cells in series. Spin coating, which may not be compatible with roll-to-roll processing, spray coating and doctor blading are coating techniques using which continuous layers, i.e. unpatterned layers, can be obtained. In order to fabricate modules from the unpatterned layers using traditional methods, additional patterning techniques such as mechanical scribing or laser scribing may be employed. These methods, however, apart from the extra processes and higher production costs, can have certain undesirable effects, such as increased risk of damage to the underlying layers and potentially the flexible foil that is commonly used as the holding substrate.

In addition, the organic photoactive layer may be patterned by a relatively fast technique, such as mechanical scribing or laser scribing. However, such techniques can create excessive debris, which may have certain additional undesirable effects, such as increased risk of electrical short-circuiting through the organic photoactive layer after deposition of top electrodes. Furthermore, when using mechanical scribing or laser scribing for patterning the photoactive layer, there may be additional undesirable effects such as increasing the risk of damaging the underlying substrate.

Techniques such as slot die coating can be used to form simple patterned lines on the substrate. In addition, printing methods such as screen printing, gravure printing and flexographic printing can be used to form more complex patterns, such as serial/parallel connections between single cells within the module. Some of these techniques, however, may require specialized pieces of equipment, as well as the adaptation of deposition conditions for small area devices to those for large area devices. These conditions, e.g. primarily drying, define the bulk morphology of the organic photovoltaic cell, e.g. of the polymer:fullerene film, and thus may be important for maximizing the power conversion efficiency of the final solar cell. In the following, a manufacturing process is disclosed, which may benefit from the advantages provided by spray coating and may allow for direct patterning of the photoactive film.

Furthermore, in "Effect of Self-assembled Monolayers on the Performance of Organic Photovoltaic Cells," by H. Bedis, in Journal of Surface Engineered Materials and Advanced Technology, 2011, 1, p. 42-50, the use of self-assembled monolayers (SAM) have been proposed to improve the carrier injection into an organic semiconductor, and to improve the adhesion of the organic material on a metal or oxide electrode and the photovoltaic performance of an organic cell.

SUMMARY OF CERTAIN INVENTIVE ASPECTS

It is an object of embodiments of the present disclosure to provide good and efficient patterning of an organic semiconductor layer on a substrate. It is an advantage of embodiments of the present disclosure that good organic photovoltaic modules can be manufactured in an efficient manner. The patterned organic semiconductor layer to be obtained may correspond to a plurality of individual photoactive cells of a module or array. The patterned organic semiconductor layer may be an organic photoactive layer. In some embodiments, the organic semiconductor layer may for example be an organic electroluminescent layer and patterning may define a plurality of organic light emitting diodes (OLEDs) forming an OLED array.

It is an advantage of a method according to embodiments of the present disclosure that a low or reduced risk on debris is achieved. It is an advantage of a method according to embodiments of the present disclosure that the risk of damaging the substrate can be minimized.

For example, it is an advantage of a method according embodiments of the disclosure that the need for performing a process of patterning the organic semiconductor layer after organic semiconductor layer deposition is avoided, such that debris formation and the corresponding risks are reduced or even avoided.

It is an advantage of a method according to embodiments of the present disclosure that a patterning process of the organic semiconductor layer after organic semiconductor layer deposition is not required, and therefore the risk of damaging the substrate, as may occur when using scribing methods, is reduced or avoided. Therefore, according to embodiments of the present disclosure, the requirements on the substrate can be relaxed and embodiments can advantageously be used on a wide variety of substrates, such as glass substrates, plastic substrates or foils, steel foils, and any suitable substrate known to a person skilled in the art.

It is an advantage of a method according to embodiments of the present disclosure that a solution-process compatible method for patterning an organic semiconductor layer, e.g. a photoactive layer, is provided.

It is an advantage of a method according to embodiments of the present disclosure that a roll-to-roll compatible patterning method for an organic semiconductor layer, e.g. a photoactive layer, is provided.

The above objective is accomplished by a method according to the present disclosure.

The present disclosure relates to a method of forming a patterned organic semiconductor layer, in which the method comprises: providing on a substrate a plurality of first electrodes; providing a patterned self-assembling monolayer (SAM), sometimes referred to as a self-assembled monolayer, at predetermined locations on each of the plurality of first electrodes; and providing a layer comprising an organic semiconductor material over the patterned self-assembled monolayer, e.g. over the entire substrate.

In a method according to embodiments of the present disclosure, providing the patterned self-assembling monolayer may comprise providing a patterned self-assembling monolayer adapted for locally repelling the layer comprising the organic semiconductor material. Providing a layer comprising an organic semiconductor material over the patterned self-assembling monolayer thus may comprise applying the layer comprising an organic layer over the entire substrate and allowing repelling of the organic semiconductor material by the patterned self-assembling monolayer thus obtaining a patterned layer comprising organic semiconductor material.

Providing the patterned self-assembling monolayer may comprise providing the monolayer according to a pattern whereby the pattern covers regions of the substrate where no layer comprising organic semiconductor material is to be present after the method for patterning an organic semiconductor material is finalised.

In a method according to embodiments of the present disclosure, providing the patterned self-assembling monolayer at predetermined locations may comprise providing the patterned self-assembling monolayer at predetermined locations corresponding to a portion of each of the plurality of first electrodes.

In a method according to embodiments of the present disclosure, providing the layer comprising the organic semiconductor material may comprise providing a solvent based organic semiconductor material. For example, providing the layer comprising the semiconductor material may comprise providing this layer by means of solution based processing. In embodiments of the present disclosure, providing the layer comprising the semiconductor material may comprise providing this layer by evaporation of small molecules.

In a method according to embodiments of the present disclosure, providing the patterned self-assembling monolayer may comprise providing a patterned self-assembling monolayer which comprises a material for repelling the solvent.

In a method according to embodiments of the present disclosure, the SAM layer may repel the layer comprising the organic semiconductor material, thereby patterning the organic semiconductor layer. Although the layer comprising the organic semiconductor material may be provided over the entire substrate surface, it is an advantage that openings may be automatically created in the semiconductor layer at locations where the repelling SAM layer is present. The SAM layer may therefore be patterned such that it is only present at predetermined locations where in the final device no organic semiconductor layer is needed. For example, the SAM layer can be patterned such that it is provided on a portion of each of the plurality of first electrodes.

A method according to embodiments of the present disclosure, may further comprise performing a drying process for evaporating the solvent from the layer of organic semiconductor material, e.g. the method may comprise performing a drying process during or after providing the layer of semiconductor material. Performing the drying process after providing the organic semiconductor layer may comprise evaporation of the solvents without any heat treatment, for example in air or in an atmosphere comprising the same solvent or solvent mixture. The drying process after providing the organic semiconductor layer may also comprise performing a heat treatment. Such a heat treatment or annealing can be done after deposition of the organic semiconductor layer or during deposition of the organic semiconductor layer. The annealing temperature may be lower than about 200° C.

A method according to embodiments of the present disclosure may further comprise providing a charge injection layer on at least the plurality of first electrodes before providing the patterned self-assembling monolayer. It is an advantage of providing a charge injection layer on the plurality of first electrodes that it creates a good electrical contact with a low contact resistance between the organic semiconductor layer and the plurality of first electrodes. The charge injection layer may be a hole injection layer or an electron injection layer. The charge injection layer preferably has dangling oxygen bonds. The charge injection layer may for example be a metal oxide layer. Examples of suitable hole injection layers include $MoO_3$, $WO_3$, $V_2O_5$ and NiO. Examples of suitable electron injection layers include $TiO_x$, ZnO and PbO.

A method according to embodiments of the present disclosure, may comprise performing a heat treatment for inducing a reaction of the self-assembling monolayer material with the material of the plurality of first electrodes and/or with the material of the charge injection layer.

A method according to embodiments of the present disclosure, may furthermore comprise the process of providing a plurality of second electrodes on the layer comprising the organic semiconductor material, e.g. a method according to embodiments may comprise providing a plurality of second electrodes after providing the layer comprising the organic semiconductor material. Providing the plurality of second electrodes may result in an electrical contact between at least one second electrode and at least one first electrode. This electrical contact may be established through the SAM layer.

In a method according to embodiments of the present disclosure, providing the patterned self-assembling monolayer at predetermined locations may comprise providing the patterned SAM layer by means of a printing method such as inkjet printing. After providing the SAM layer a heating process, such as heating to a temperature in the range between about 40° C. and 200° C., depending on the materials used, may optionally be performed to induce reaction of the SAM layer material with the material of the charge injection layer or the material of the plurality of first electrodes.

In a method according to embodiments of the present disclosure, providing the patterned self-assembling monolayer may comprise providing the patterned self-assembling monolayer at predetermined locations for defining a plurality of photoactive cells of an organic photovoltaic module or array to be formed on the substrate.

In a method according to embodiments of the present disclosure, providing the patterned self-assembling monolayer may comprise providing the patterned self-assembling monolayer at predetermined locations for defining a plurality of organic light emitting diodes of an OLED array to be formed on the substrate.

In a method according to embodiments of the present disclosure, providing the layer comprising an organic semiconductor material may comprise providing an organic electroluminescent layer.

The SAM layer molecules may be selected such that one end of the molecules, e.g. the head group, reacts with the material of the plurality of first electrodes or with the material of the charge injection layer, e.g. metal oxide layer, if present on the plurality of first electrodes, while an opposite end of the SAM, e.g. the tail, comprises a functional group that is selected for repelling solvents, more in particular solvents that are used for depositing the organic semiconductor layer. The functional group at the tail of the SAM can e.g. comprise fluorine atoms. For example, silanes such as trichlorosilanes and trialkoxysilanes, carboxylic acids, phosphonic acids, or fluorinated catechol can be used for forming the SAM layer, because these molecules react with the hydroxyl groups of the charge injection layer or the first electrode material (e.g. ITO), leading to strong covalent chemical bonds. Alternatively, when the material of the plurality of first electrodes is a metal such as Au, Ag, Cu or Fe, thiols, selenols, dissulfides or diselenides may be used for forming the SAM layer.

The layer comprising the organic semiconductor material may be preferably solvent based, wherein the solvent is selected to be repelled by the SAM layer. For example, when a SAM with a fluorinated tail is used, the solvent can be a non-fluorinated solvent such as for example a solvent or solvent mixture comprising aromatics (such as e.g. xylene, toluene, 1,3,5-trimethylbenzene), halogenated aromatics (such as e.g. chlorobenzene, dichlorobenzene), alcohols (such as e.g. methanol, ethanol), ketones (such as e.g. acetone, methylethylketone), halogenated alkanes (such as e.g. chloroform, dichloromethane) and water. Other examples of solvents that may be used are: alkanes (such as e.g. heptane, octane), ethers (such as e.g. anisole), amides (such as e.g. dimethylformamide), and sulfoxides (such as e.g. dimethylsulfoxide). In other embodiments, still other SAM/solvent combinations may be used, such as for example an ODTS (octadecyltrichlorosilane) SAM layer material with anisole and/or DMF (dimethylformamide) as a solvent or for example UETS (10-undecenyltrichlorosilane) as a SAM layer material with dimethylsulfoxide as a solvent. The contact angle of the solvent on the SAM layer may be larger than about 45 degrees, e.g., may be larger than 45 degrees, e.g., may be in the range of 45 to 90 degrees.

The present disclosure also relates to a semiconductor device, the semiconducting device comprising a substrate comprising a plurality of first electrodes, elements of a self-assembling monolayer distributed according to a pattern at least at predetermined locations on the first electrodes, and a patterned organic semiconductor layer, the organic semiconductor layer at least not being present at positions where the elements of the self-assembling monolayer are present. The device furthermore may comprise a charge injection layer positioned between the first electrodes and the organic semiconductor layer. The elements of a self-assembling monolayer may form the full self-assembling monolayer.

The elements of the self-assembling monolayer may comprise a solvent repelling material. The elements of the self-assembling monolayer may comprise functional groups having a solvent repelling property.

The device furthermore may comprise second electrodes. The patterned organic semiconductor layer may be an organic photoactive layer. The patterned organic semiconductor layer may be an electroluminescent layer.

The patterned organic semiconductor layer may comprise a plurality of portions arranged for being used in individual photoactive cells.

The present disclosure furthermore relates to a semiconductor device obtained using a method as described above.

The present disclosure also relates to an organic photovoltaic module comprising a plurality of monolithically integrated photovoltaic cells, the organic photovoltaic module comprising a semiconductor device as described above, wherein a patterned organic semiconductor layer of the semiconductor device is an active layer of the plurality of monolithically integrated photovoltaic cells.

Particular and preferred aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

BRIEF DESCRIPTION OF THE DRAWINGS

FIG. 14 shows dried active layer profiles for conventional cell architecture on $MoO_3$ and for inverted architecture on ZnO, according to embodiments of the present disclosure.

FIG. 15 shows a microscope image of patterned lines for a standard architecture device with a resolution of 400 μm, according to embodiments of the present disclosure.

FIG. 16 shows a microscope image of patterned lines for an inverted architecture device with a resolution of 120 μm, according to embodiments of the present disclosure.

Figure 1:
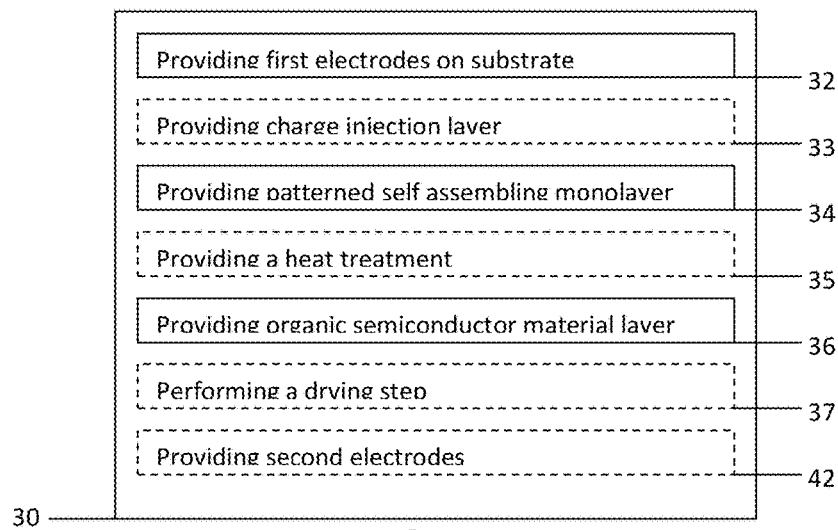
FIG. 1 illustrates an exemplary method according to embodiments of the present disclosure.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

As used herein, the term "comprising" as may be used in the claims, should not be interpreted as being restricted to the means listed thereafter, or as excluding other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present disclosure a reference is made to "an organic semiconductor material," reference is made to an organic material with semiconductor properties. Such material may comprise semiconducting small molecules, e.g. aromatic hydrocarbons such as the polycyclic aromatic compounds pentacene, anthracene, and rubrene, and/or short chain (oligomers) or polymeric organic semiconductors, e.g. poly(3-hexylthiophene), poly(p-phenylene vinylene) and polyacetylene or derivatives thereof, e.g. polypyrrole and polyaniline. These materials may comprise organic charge-transfer complexes or various linear-backbone conductive polymers derived from polyacetylene. Like inorganic semiconductors, some organic semiconductor materials may also be doped. Examples of organic semiconductors that are particularly suitable for doping include, for example, polyaniline and PEDOT:PSS. Organic semiconductor materials may further comprise dyes, e.g. fluorescent and/or phosphorescent dyes, for obtaining advantageous light emission or absorption properties. Fluorescent dyes can be chosen to obtain light emission at different wavelengths, for example compounds such as perylene, rubrene and quinacridone derivatives may be used.

For example, Alq$_3$ may be used as a green emitter, electron transport material and/or as a host for yellow and red emitting dyes. Derivatives of poly(p-phenylene vinylene) and polyfluorene may be used, where substitution of side chains onto the polymer backbone may determine the colour of emitted light or the stability and solubility of the polymer for performance and ease of processing. A polymer such as poly(n-vinylcarbazole) may be used as a host material to which an organometallic complex is added as a dopant. For example, iridium complexes such as Ir(mppy)$_3$ and complexes based on other heavy metals such as platinum can be used.

The disclosed technology relates, in a first aspect, to a method for forming on a substrate a patterned organic semiconductor layer, such as an organic photoactive layer. In embodiments according to the present disclosure, this patterned organic semiconductor layer may be formed such as to define individual photoactive cells of a module or array. Furthermore, the patterned organic semiconductor layer may be formed on the substrate in order to fabricate an organic semiconductor device on the substrate. In embodiments according to the present disclosure, the organic semiconductor layer may be described as an organic photoactive layer and the process of patterning the organic semiconductor layer may define a plurality of organic photovoltaic cells forming an organic photovoltaic module. However, the present disclosure is not limited thereto. For example, a method according to embodiments of the present disclosure may also be used for fabricating a plurality of organic light emitting diodes (OLEDs), forming for example an OLED array.

The disclosed technology relates in a first aspect to a method which comprises the processes of providing on a substrate a plurality of first electrodes, providing a patterned self-assembling monolayer (SAM), sometimes referred to as a self-assembled monolayer, at predetermined locations on each of the plurality of first electrodes and providing a layer comprising an organic semiconductor material over the patterned self-assembling monolayer. The layer comprising an organic semiconductor material may be provided over substantially the entire substrate surface, e.g. over the entire substrate surface. For example, the layer comprising the organic semiconductor material may be provided as a blanket layer over a continuous area, or may be provided to form a contiguous area, in which this continuous or contiguous area covers the predetermined locations or covers the plurality of first electrodes. Advantageously, although the layer comprising the organic semiconductor material may be provided as a blanket layer, openings may be formed automatically within the blanket layer. The openings may be formed, e.g. at the predetermined locations where the SAM layer is present. Without being bound to any theory, the openings may be formed, for example, by a repulsive force between a material in the SAM layer and a material in the organic semiconductor layer. Advantageously, the SAM layer may be patterned such that it is only present at predetermined locations where in the final device no organic semiconductor layer is needed.

Referring to FIG. 1, an exemplary method 30 is illustrated for forming on a substrate a patterned organic semiconductor layer according to some embodiments, other embodiments not being limited thereby. The method 30 comprises providing 32 on a substrate a plurality of first electrodes. The substrate may be selected from a wide variety of substrates, such as glass substrates, plastic substrates, e.g. plastic foils, semiconductor substrates, metal foils, e.g. steel foils, and any suitable substrate known to a person skilled in the art. The plurality of first electrodes may comprise any suitable electrically conductive material, e.g. a metal, such as copper, gold or platinum, a metal alloy or a conductive polymer. The plurality of first electrodes may be provided 32 on the substrate by patterning an electrically conductive layer such as e.g. an ITO (indium-tin-oxide) layer or any suitable electrically conductive layer known by a person skilled in the art, such as for example a metal layer. The plurality of first electrodes may be adapted in size and shape to correspond with the size and shape of individual cells, e.g. discrete elements in an array, to be fabricated.

The method 30, according to some embodiments of the present disclosure, may additionally comprise providing 33 a charge injection layer on at least the plurality of first electrodes before, in a later process, providing 34 a patterned self-assembling monolayer. Advantageously, providing the charge injection layer on the plurality of first electrodes can provide an improved electrical contact with a low contact resistance between the organic semiconductor layer and the plurality of first electrodes, compared to embodiments where the charge injection layer is not provided according to some other embodiments. In some embodiments, providing the charge injection layer comprises providing an electron hole injection layer, while in some other embodiments, providing the charge injection layer comprises providing a hole injection layer. The charge injection layer material can advantageously have dangling oxygen bonds, which can enable omitting additional treatments to create such dangling oxygen bonds where they are desired. In some embodiments, the charge injection layer may a metal oxide layer. Examples of suitable hole injection layers include MoO$_3$, WO$_3$, V$_2$O$_5$ and NiO. Examples of suitable electron injection layers include TiO$_x$, ZnO and PbO. The charge injection layer may have a thickness, for example, in the range between about 2 nm and about 100 nm.

The method 30 further comprises providing 34 a patterned self-assembling monolayer (SAM), or a self-assembled monolayer, at predetermined locations on each of the plurality of first electrodes, according to some embodiments. The patterned self-assembling monolayer may be adapted for repelling, e.g. locally repelling the layer comprising the organic semiconductor material, which is provided 36 in a later process the method 30. The predetermined locations may correspond to a portion of each of the plurality of first electrodes. These predetermined locations may correspond to, without being bound to any theory, locations where repelling the organic semiconductor material is desirable, e.g., to form openings in the layer comprising the organic semiconductor material, for example to induce local discontinuities of electrical conduction in this layer. The presence of the SAM layer at the predetermined locations can advantageously enable formation of discontinuities or openings in the layer comprising the organic semiconductor material automatically without performing additional processes to create the discontinuities or the openings, simply by providing the organic semiconductor material in the form of, for example, a blanket layer over substantially the entire substrate surface having the SAM layer formed thereon at the predetermined locations. Thus, the SAM layer may be adapted for repelling the layer comprising the organic semiconductor material, thereby patterning the organic semiconductor layer without the need for a separate patterning process. In some embodiments, providing 34 the patterned self-assembling monolayer may comprise providing the patterned SAM layer by means of a printing method such as inkjet printing.

For example, the patterned self-assembling monolayer may be provided 34 at predetermined locations for defining a plurality of photoactive cells of an organic photovoltaic module or array to be formed on the substrate, or the patterned self-assembling monolayer may be provided at predetermined locations for defining a plurality of organic light emitting diodes of an OLED array to be formed on the substrate.

In some embodiments, the method 30 may additionally comprise performing 35 a heat treatment for inducing a reaction between the self-assembling monolayer material and the material of the plurality of first electrodes and/or with the material of the charge injection layer when present, such as by heating to a temperature in the range between about 40° C. and 200° C., which temperature may be selected depending on the materials used. The heat treatment may be combined with a drying 37 process as described below, or may be performed separately.

The method 30 further comprises providing 36 a layer which comprises an organic semiconductor material over the patterned self-assembling monolayer. The layer comprising an organic semiconductor material may be provided over substantially the entire substrate surface, e.g. over the entire substrate surface. For example, providing 36 the layer comprising an organic semiconductor material may comprise providing an organic electroluminescent layer, or providing 36 the layer comprising an organic semiconductor material may comprise providing an organic photovoltaic layer.

In some embodiments, the organic semiconductor material may be a solvent-based organic semiconductor material, e.g., comprising one or more solvents, e.g., comprising a solvent or solvent mixture. Advantageously, the layer comprising the organic semiconductor material may be provided 36 by means of solution-based processing. Furthermore, the patterned self-assembling monolayer may comprise a material configured to repel the one or more solvents or the mixture of solvents.

In an alternative embodiment, the organic semiconductor material may be provided by evaporating small molecules onto the substrate.

The method 30 may also comprise performing 37 a drying process for evaporating the solvent or solvent mixture from the layer of organic semiconductor material, according to some embodiments. This drying process may comprise exposing the layer of organic semiconductor material to air or to an atmosphere comprising the same solvent or solvent mixture. For example, the layer comprising the organic semiconductor material may be provided by applying the solvent based organic semiconductor material and evaporating the solvent therefrom.

The method 30 may additionally comprise providing 42 a plurality of second electrodes on the layer comprising the organic semiconductor material. This may result in an electrical contact between at least one second electrode and at least one first electrode, e.g. an electrical contact which is established through the SAM layer. Furthermore, the second electrodes for example may electrically connect neighboring photovoltaic cells, e.g. to provide an electrical connection in series of these cells, thus forming a module of connected cells.

The molecules of the SAM layer may be selected to have one end of the molecules (the head group) that is configured to react with the material of the plurality of first electrodes or with the material of the charge injection layer, e.g. metal oxide layer, if present on the plurality of first electrodes, and to have an opposite end of the molecules comprising a functional group that is configured to repel solvents, e.g., a functional group that is configured to repel solvents that are used for depositing the organic semiconductor layer. The functional group at the tail of the SAM can, e.g., comprise fluorine atoms. For example, silanes such as trichlorosilanes and trialkoxysilanes, carboxylic acids, phosphonic acids, or fluorinated catechol can be used for forming the SAM layer, because these molecules can react with the hydroxyl groups of the charge injection layer or the first electrode material (e.g. ITO), leading to strong covalent chemical bonds. Alternatively, when the material of the plurality of first electrodes is a metal, such as Au, Ag, Cu or Fe, thiols, selenols, dissulfides or diselenides can be used for forming the SAM layer. However, the present disclosure is not limited hereto and other suitable SAM layer molecules may be used.

For example, in some embodiments, when a SAM with a fluorinated tail is used, the solvent can be a non-fluorinated solvent such as for example a solvent or solvent mixture comprising aromatics (such as e.g. xylene, toluene, 1,3,5-trimethylbenzene), halogenated aromatics (such as e.g. chlorobenzene, dichlorobenzene), alcohols (such as e.g. methanol, ethanol), ketones (such as e.g. acetone, methylethylketone), halogenated alkanes (such as e.g. chloroform, dichloromethane) and water. Other examples of solvents that may be used are: alkanes (such as e.g. heptane, octane), ethers (such as e.g. anisole), amides (such as e.g. dimethylformamide), and sulfoxides (such as e.g. dimethylsulfoxide). In some other embodiments, other SAM/solvent combinations can be used, such as for example an ODTS (octadecyltrichlorosilane) SAM layer material with anisole and/or DMF (dimethylformamide) as a solvent or for example UETS (10-undecenyltrichlorosilane) as a SAM layer material with dimethylsulfoxide as a solvent. The contact angle of the solvent on the SAM layer may be larger than about 45 degrees.

Thus, a fluorinated self-assembled monolayer may be formed on top of the bottom contact prior to the deposition of the photoactive film. Thin lines of 1H,1H,2H,2H-Perfluorodecyltrichlorosilane (FDTS) may be printed on the substrate with an inkjet printer. Due to the high contact angle between FDTS and the primary solvent, e.g. ortho-dichlorobenzene, used in the solution of the photoactive material, the liquid film is repelled from these lines, resulting in a fast and economic patterning of the photoactive layer.

An exemplary process flow of a fabrication process for an organic photovoltaic module wherein the organic semiconductor layer is patterned in accordance with one embodiment is schematically illustrated in FIG. 2 to FIG. 11.

Figure 2:
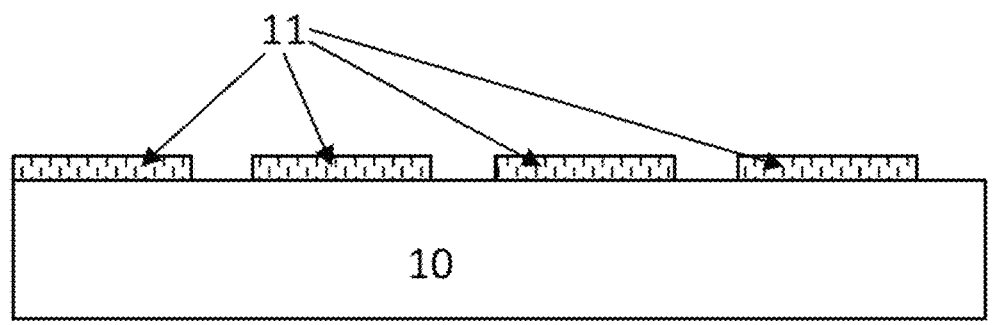
FIG. 2 is a cross-sectional view illustrating the process of providing a plurality of first electrodes on a substrate according to embodiments of the present disclosure.
Figure 3:
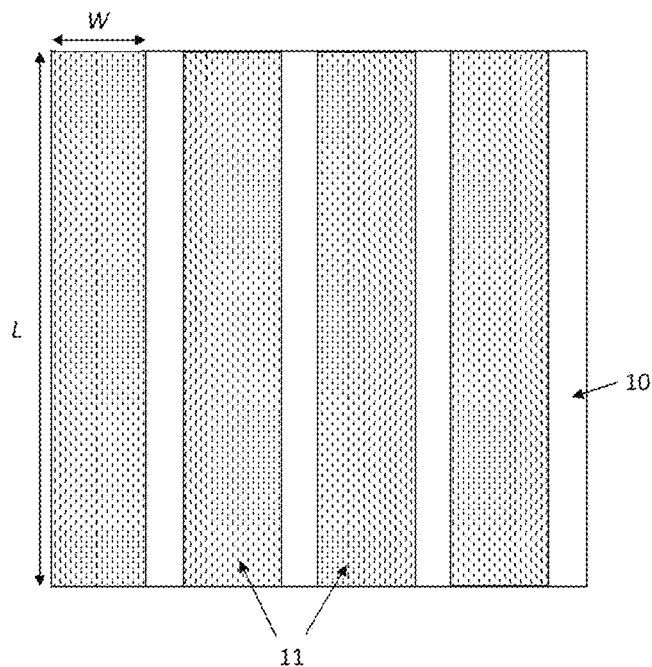
FIG. 3 shows a top-down view illustrating the process of providing a plurality of first electrodes on a substrate according to embodiments of the present disclosure.

On a substrate 10, such as for example a glass substrate, a plurality of first electrodes 11 is provided, as shown in a cross-sectional view of FIG. 2 and the corresponding top-down view of FIG. 3. The plurality of first electrodes 11 comprises a patterned electrically conductive layer such as, e.g., an ITO (indium-tin-oxide) layer or any suitable electrically conductive layer, such as for example a metal layer. The plurality of first electrodes 11 has a size and shape in accordance with the size and shape of the individual cells to be fabricated. For example, as illustrated in FIG. 2, the plurality of first electrodes 11 can comprise a plurality of rectangle-shaped electrodes (top view). For example, the width W of the rectangles can be in the range between about 0.5 cm and about 2 cm, and the length L can be several centimeters, for instance about 5 cm. The spacing between neighboring first electrodes 11 may be as small as possible, for example in the range between about 10 micrometer and 500 micrometer, in the range between about 20 micrometers and 100 micrometers, for instance about 50 micrometers. However, the present disclosure is not limited thereto and the plurality of first electrodes 11 can have other dimensions and/or other spacings and/or they can have a shape different from a rectangle shape.

Figure 4:
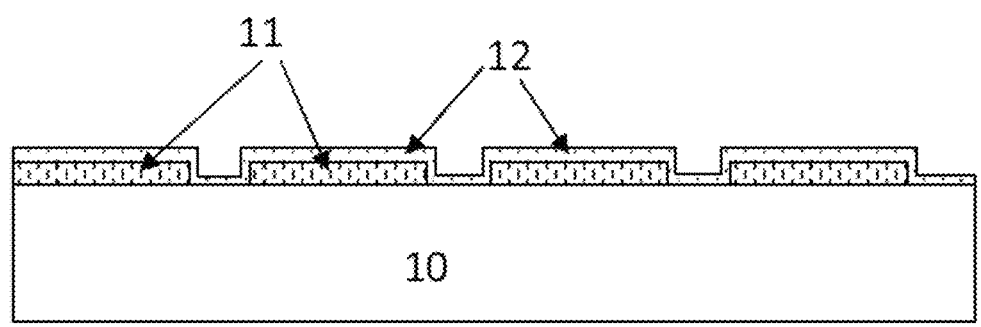
FIG. 4 shows a cross-sectional view illustrating the process of providing a charge injection layer according to embodiments of the present disclosure.
Figure 5:
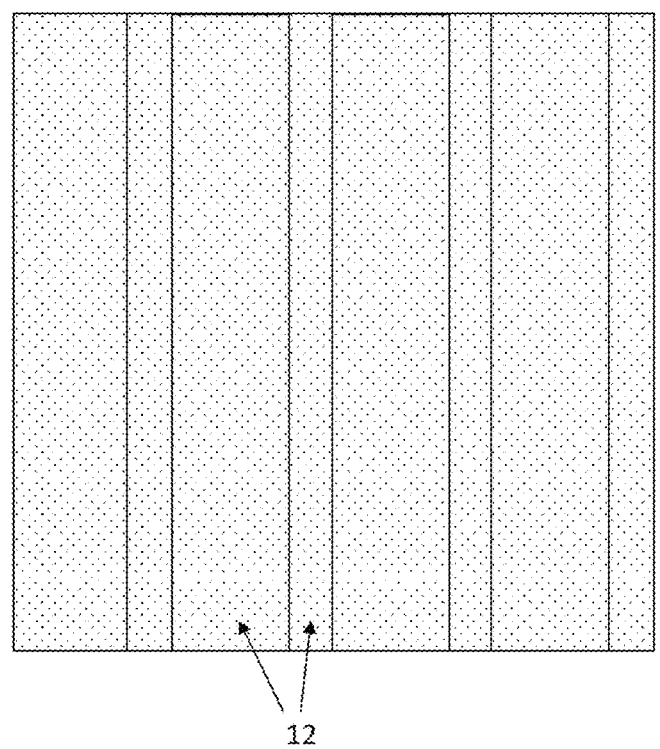
FIG. 5 shows a top-down view illustrating the process of providing a charge injection layer according to embodiments of the present disclosure.

Next, as shown in a cross-sectional view of FIG. 4 and the corresponding top-down view of FIG. 5, on top of the substrate 10 and the plurality of first electrodes 11 a charge injection layer 12 may be provided, the charge injection layer 12 for example having a thickness in the range between about 2 nm and about 100 nm, according to some embodiments. The charge injection layer 12 formed on the plurality of first electrodes 11 can advantageously create an improved electrical contact with a low contact resistance between the organic photoactive layer and the first electrodes. The charge injection layer 12 may comprise a metal oxide such as for example molybdenum trioxide ($MoO_3$). In view of the subsequent SAM deposition, a charge injection layer having dangling oxygen bonds is preferred. It can be an advantage to use a charge injection layer having dangling oxygen bonds where the dangling bonds are desirable to have, because additional treatment processes for creating the dangling oxygen bonds after the deposition can be omitted.

Figure 6:
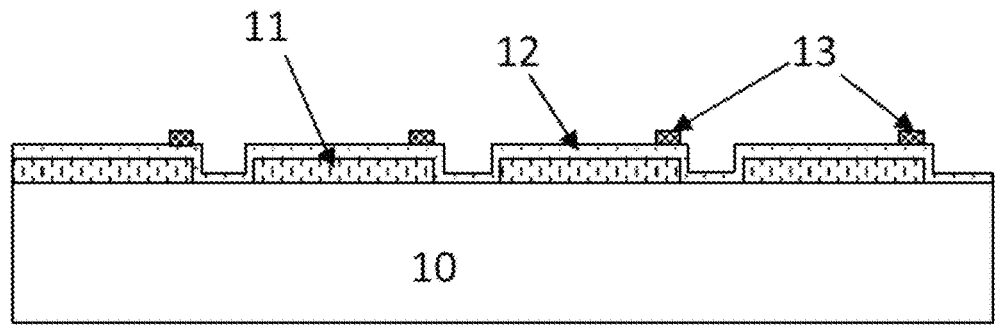
FIG. 6 shows a cross-sectional view illustrating the process of providing a self-assembling monolayer according to embodiments of the present disclosure.
Figure 7:
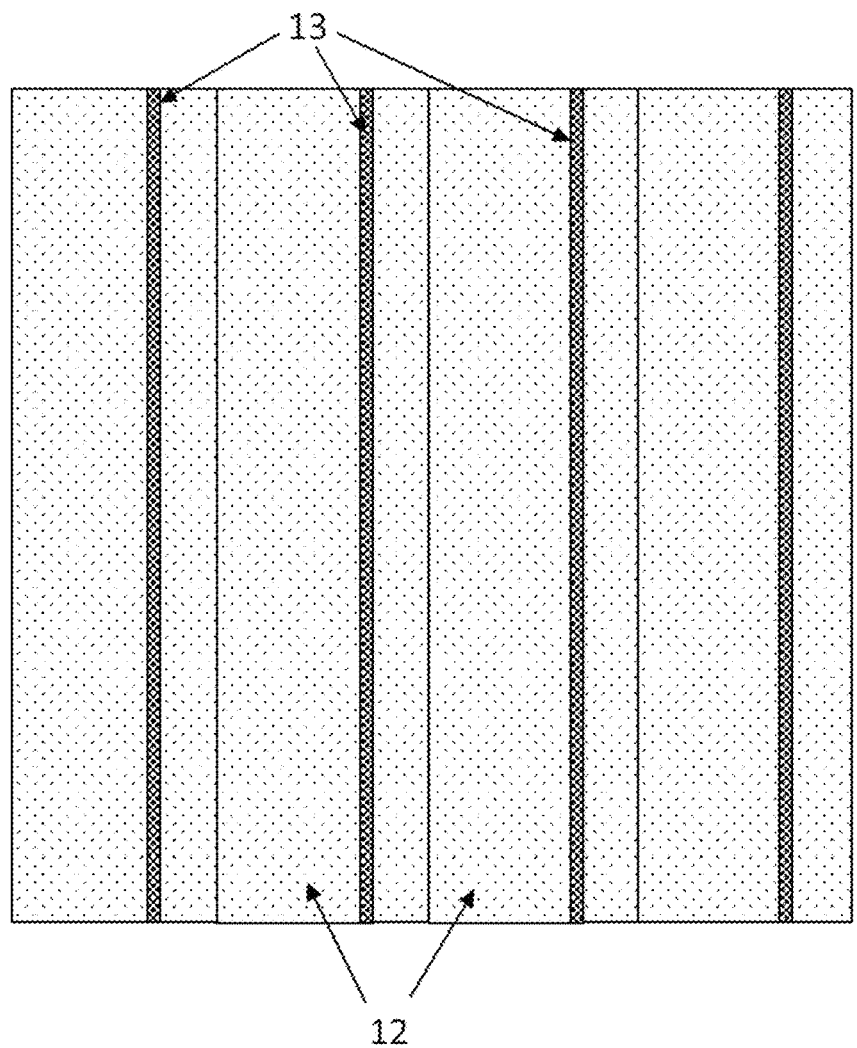
FIG. 7 shows a top-down view illustrating the process of providing a self-assembling monolayer according to embodiments of the present disclosure.

As illustrated in FIG. 6 and FIG. 7, a patterned SAM layer 13 having solvent-repelling properties may subsequently be provided on top of the charge injection layer 12 according to some embodiments, where the SAM layer 13 covers a portion of each of the plurality of first electrodes 11. In one embodiment wherein no charge injection layer 12 is used, the patterned SAM layer 13 can be provided directly on top of the plurality of first electrodes 11. The SAM layer 13 can be patterned such that it is only provided at locations where in the final device the photoactive layer (to be provided in a further process) is not to be present. In the illustrated example shown in FIG. 6 and FIG. 7, the pattern of the SAM layer 13 comprises a plurality of narrow rectangles ('lines'), where one narrow rectangle or line is provided on each of the plurality of first electrodes 11. Each rectangle of the SAM layer 13 extends over the entire length direction of the plurality of first electrodes 11 and it is narrow in a width direction (e.g. having a width in the range between about 10 micrometer and 500 micrometer) of the first electrodes 11, i.e. substantially narrower than the first electrodes 11. The SAM layer lines are located at an edge of the first electrodes 11. In some embodiments, the patterned SAM layer 13 comprises very small features, in order to limit the active area loss in the photovoltaic module. However, the present disclosure is not limited to the SAM layer pattern illustrated in FIG. 6 and FIG. 7, and other suitable SAM layer patterns may be used.

A roll-to-roll compatible method such as inkjet printing can advantageously be used for depositing the patterned SAM layer. For example, a fluorinated SAM such as FDTS (perfluoro-decyltrichlorosilane) can be used. To enable inkjet printing, FDTS can be dissolved in a solvent, e.g. an alkane such as octane or hexadecane, to form an ink. However, the present disclosure is not limited thereto and other methods can be used for providing the SAM layer, such as for example microcontact printing, or methods such as spray coating or blade coating using a mask during deposition or with patterning after deposition.

After providing the self-assembled SAM layer 13, the solvent may be evaporated, and/or an additional heating process may be used to induce a reaction between the SAM layer 13 and the charge injection layer 12, or in the absence of a charge injection layer 12, between the SAM layer 13 and the first electrodes 11. The heating process can also be performed during the SAM deposition, e.g., in-situ, by depositing the SAM layer 13 on a heated substrate, for example at a temperature in the range between about 50° C. and 150° C. Optionally a rinsing process (e.g., with a solvent) may be performed afterwards to remove any unreacted SAM material.

Figure 8:
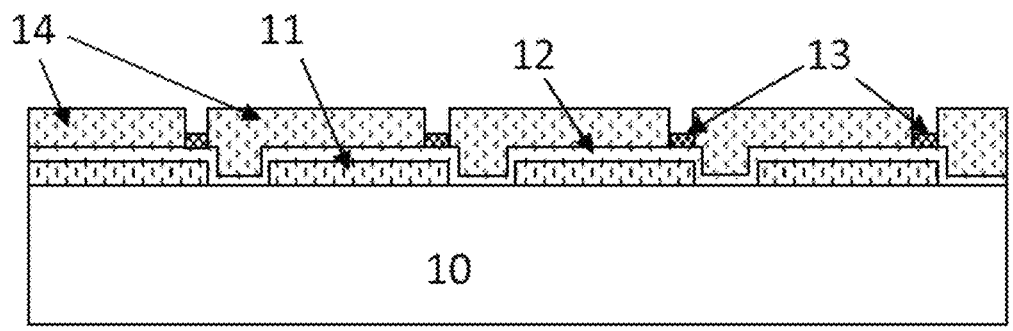
FIG. 8 shows a cross-sectional view illustrating the process of providing layer comprising an organic semiconductor material according to embodiments of the present disclosure.
Figure 9:
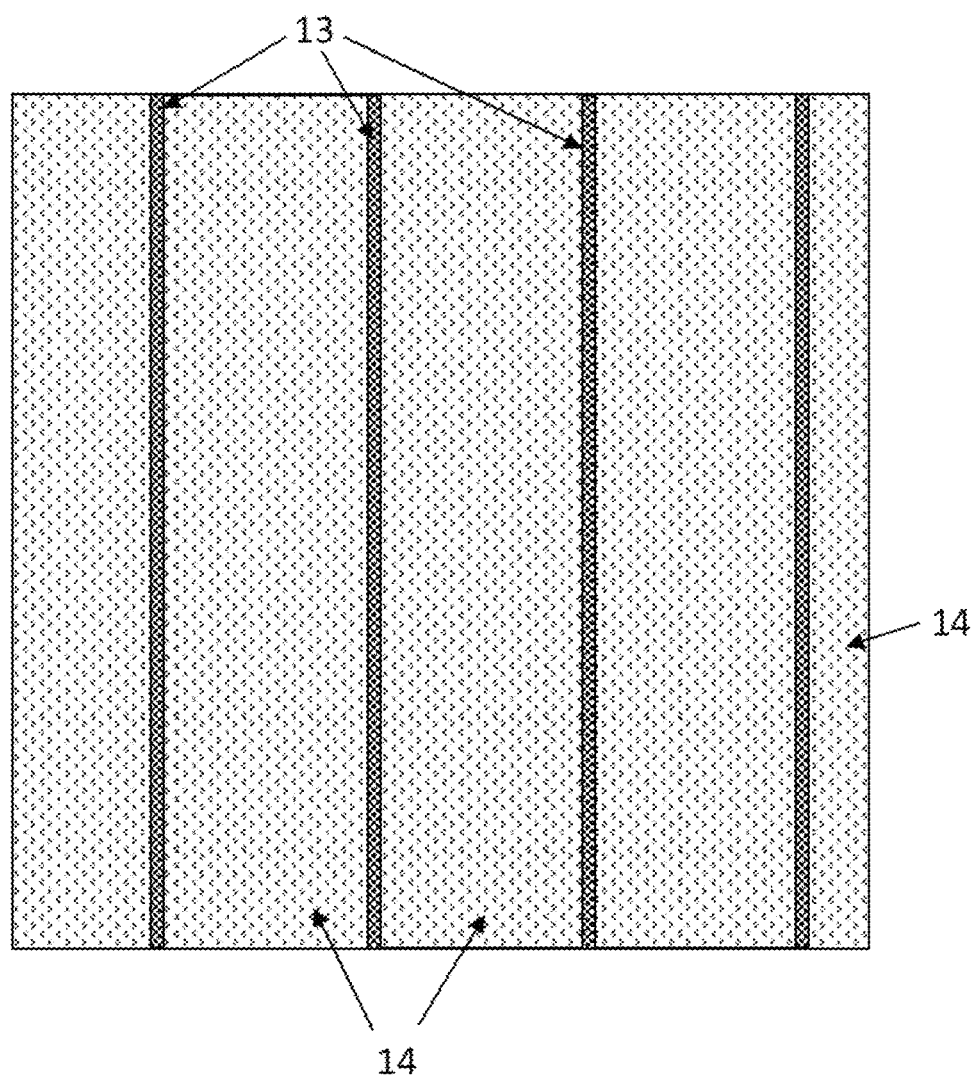
FIG. 9 shows a top-down view illustrating the process of providing layer comprising an organic semiconductor material according to embodiments of the present disclosure.

Next, as illustrated in FIG. 8 and FIG. 9, after solvent evaporation, a layer 14 comprising a mixture of an organic photoactive material and a solvent (or solvent mixture) is provided on the substrate, according to some embodiments. In some embodiments, the layer 14 can be provided, using a suitable roll-to-roll compatible method such as spray coating, blade coating, gravure printing, or inkjet printing, among others. For example, the organic photoactive material can comprise a 1:1 P3HT:PCBM (poly(3-hexylthiophene): phenyl-C61-butyric acid methyl ester) mixture. The solvent mixture can, for example, comprise ortho-dichlorobenzene, 1,3,5-trimethylbenzene (mesytylene). However, the present disclosure is not limited thereto and other suitable photoactive materials and/or solvents known to a person skilled in the art can be used. In some embodiments, the mixture of the organic photoactive material and the solvent is provided in the form of a blanket layer, e.g., over the entire substrate surface. The mixture is repelled from the areas covered with the SAM layer 13 while remaining on areas not comprising the SAM layer 13. After drying, the organic material is thus patterned according to the (opposite of the) SAM pattern.

In order to limit the so-called 'coffee ring' effect and to obtain a layer 14 having a substantially uniform thickness, a mixture of different solvents can be used for the active organic layer 14. By choosing a good solvent combination such undesired effects can be reduced or avoided, as for example described by C. Girotto et al in "High-Performance Organic Solar Cells with Spray-Coated Hole-Transport and Active Layers," Adv. Funct. Mater. 2011, 21, 64-72.

Figure 10:
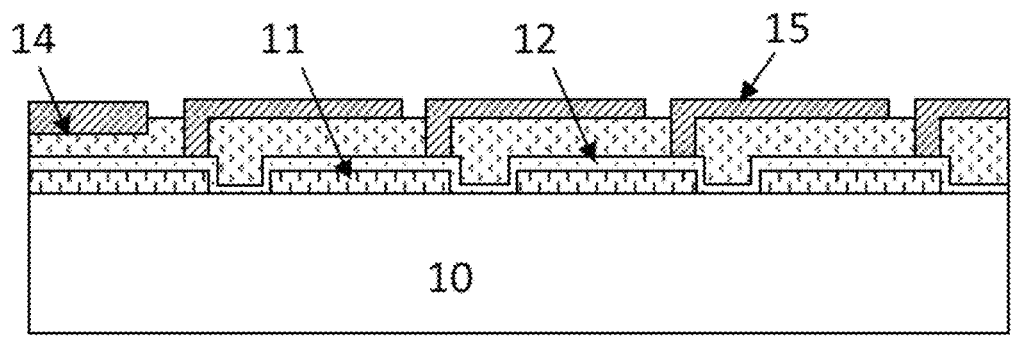
FIG. 10 shows a cross-sectional view illustrating the process of providing a plurality of second electrodes according to embodiments of the present disclosure.
Figure 11:
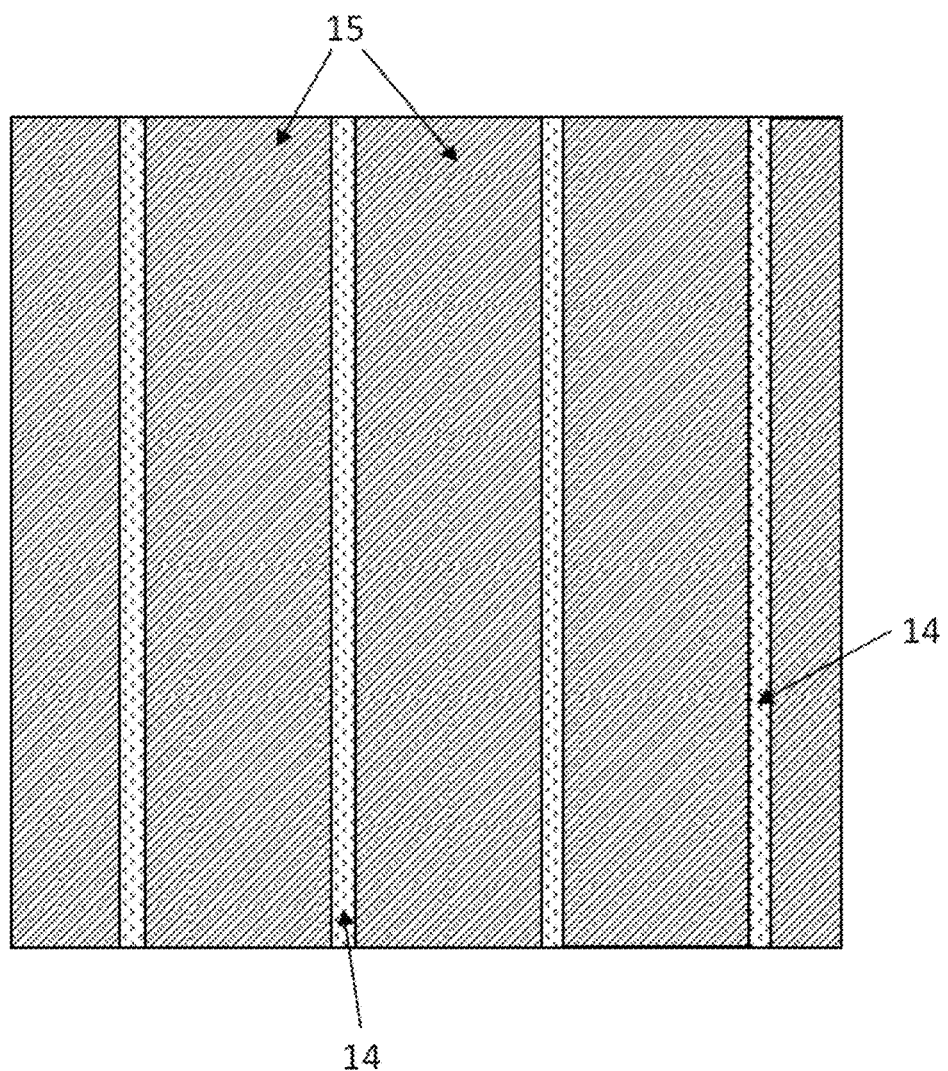
FIG. 11 shows a top-down view illustrating the process of providing a plurality of second electrodes according to embodiments of the present disclosure.

In some embodiments, the next process in the fabrication process may include the deposition of a patterned top electrode layer comprising an electrically conductive material, to form a plurality of second electrodes 15, as shown in FIG. 10 and FIG. 11. This layer can be provided, e.g. evaporated, over the entire surface. The electrically conductive material of the top electrode layer penetrates through the SAM layer 13, such that the second electrode 15 of one photovoltaic cell can make an electrical connection, e.g. via the charge injection layer 12, with the first electrode 11 of a neighboring photovoltaic cell. The top electrode layer can for example be patterned by means of laser scribing or mechanical scribing. Patterning of the top electrode layer can also be combined with the process of depositing the top electrode layer, for example by using a shadow mask during deposition.

Examples are given hereinbelow to illustrate different embodiments of the invention, with the understanding that the inventions are not limited to these forms. These examples may merely serve the purpose to explain aspects of the invention, to demonstrate improvements over methods known in the art and to provide details such that the results may be reproduced by a person skilled in the art.

In a first example, glass substrates 10 (5.5 cm×5.5 cm) were covered with a 100 nm thick Indium-Tin-Oxide (ITO) layer with a sheet resistance lower than 20 Ohm per square. The ITO layer was patterned using photolithography, thereby forming a plurality of 5 mm wide ITO stripes (plurality of first electrodes 11) with a 50 micrometer wide gap between the stripes. The substrates 10 covered with the ITO pattern were cleaned with soap, deionized water, acetone and isopropanol, and dried using nitrogen. A 5 nm thick non-patterned molybdenum oxide layer 12 was then deposited using thermal evaporation of molybdenum oxide in high vacuum.

A fluorinated self-assembled molecule (FDTS, (1H,1H,2H,2H-perfluorodecyl)trichlorosilane) was mixed with hexadecane and a small fraction of water was added in order to promote partial hydrolysis of the silane, resulting in a (50 ml Hexadecane+8.6 microliter FDTS+1.8 microliter $H_2O$) solution. This solution was filtered (polytetrafluoroethylene PTFE filter with pore diameters of 0.5 micrometer) and placed inside an inkjet printer cartridge. The cartridge was placed in the inkjet printer, and after alignment, thin lines 13 of the solution were printed on the ITO stripes, near the edges of the ITO stripes. The substrates were kept at 40° C. during printing, and for a duration of about 30 minutes after printing. Afterwards the substrates were annealed at 200° C. for 10 seconds to evaporate the excess solvent.

A P3HT:PCBM solution (1:1 mixture in ortho-dichlorobenzene) was filtered, and spread over the substrates using doctor blading. After the deposition, the substrate was covered with a petri dish to induce a slow drying of the solvent, which results in an optimized morphology in the blend. After drying, an additional annealing process was performed at 130° C. for 10 minutes.

A stack comprising a 10 nm thick ytterbium layer and a 150 nm thick silver layer was deposited using thermal evaporation for forming a plurality of second electrodes 15. The stack was provided over the entire surface and then patterned using a mechanical scriber (a knife mounted on a XYZ-stage).

The samples were measured using a Keithley 2602A measurement unit, while illuminated with simulated AM1.5G solar light (Abet solar simulator). Measurement of the module comprising ten photovoltaic cells resulted in the following parameters: short circuit current Isc=14.4 mA, open-circuit voltage Voc=4.8 V and fill factor FF=60.1%. The Voc value indicated 8 out of 10 working cells, as the Voc of a single cell is about 0.6 V. Measurement of the individual cells showed that indeed two cells were shorted.

In a second example, glass substrates (5.5×5.5 $cm^2$) with 10 individual ITO stripes (5 mm wide each with an area of 2.5 $cm^2$) and with a nominal sheet resistance of 20 Ω/square, supplied by SNP Taiwan Co., were cleaned in subsequent ultrasonic baths of detergent, deionized water, acetone and isopropanol. The substrates were exposed to 15 minutes of UV ozone treatment in a UVOCS T10X10/OES Ultraviolet Ozone Cleaning System.

Afterwards, depending on the design structure, a hole injecting layer (for conventional devices) or electron injecting layer (for inverted devices) was deposited. In the case of conventional devices, 10 nm of $MoO_3$ was deposited by thermal evaporation at $10^{-7}$ Torr and a deposition rate of 1.2 Å/s. For inverted cells, a thin film of around 20 nm of zinc acetate (Zn(ac)) was spin coated on the substrate, which was subsequently baked at 300° C. in order to transform the Zn(ac) into zinc oxide (ZnO).

A 0.5 mM FDTS solution was prepared using hexadecane as the solvent. FDTS lines were inkjet-printed (Dimatix DMP-2831) on specific places of the substrates with the plate at 40° C. The excess solvent was removed by annealing the sample at 200° C. for 5-10 sec.

Regioregular P3HT (Rieke Metals, Inc. #4002-EE): PCBM (Solenne bv.) solutions were prepared with a ratio of 1:1 by weight. Different ratio blends of ortho-dichlorobenzene (ODCB) (Sigma Aldrich) and 1,3,5-trimethylbenzene (mesitylene) (Sigma Aldrich) were used to dissolve P3HT and PCBM. Solutions were stirred at 80° C. for at least 8 hours and filtered (PTFE 0.5 μm) before processing.

A photoactive layer was deposited by spray coating (Sono-Tek Exactacoat equipped with an AccuMist 120 kHz ultrasonic atomizing nozzle) with a flow rate of 2.5 mL $s^{-1}$. The substrate temperature varied from 55° C. to 80° C. depending on the module structure, solvent blend concentration and the photoactive film profile observed, see further below. The nozzle followed a raster pattern of parallel lines over the substrate with a 7 mm pitch. Immediately following the spray coating deposition, the samples were covered with a Petri dish to create a solvent saturated environment to slow the drying and create a more favorable morphology for charge generation and transport. Films were subsequently annealed at 130° C. for 10 minutes.

Finally, 20 nm of Yb and 150 nm of Ag were thermally evaporated for conventional devices, while 10 nm of $MoO_3$ and 150 nm of Ag were deposited for inverted designs.

Before characterizing the modules, individual cells were connected in series by partially removing the top metallic contact from adjacent stripes of ITO by mechanical scribing.

The module characterization was performed in a controlled nitrogen environment with a Keithley 2602A Source-Measure Unit and an Abet solar simulator under 100 mW $cm^{-2}$ AM1.5G illumination. Film thicknesses and profiles were measured by a Dektak D150 surface profilometer.

Firstly, contact angle measurements were performed in order to analyze the adhesion properties of the FDTS as a function of the substrate treatment. Bare glass, ZnO and $MoO_3$ coated substrates were immersed in a 0.5 mM FDTS solution in hexadecane. After drying of the FDTS film, a drop of ODCB was deposited onto the substrate resulting in contact angle values of 80°, 78° and 73° for glass, ZnO and MoO3, respectively. These results gave the first evidence of the importance of the interlayer below the SAM for the resolution of the patterning. Inverted and conventional cell architecture based modules should, therefore, be optimized independently.

In order to clarify the effect of the used SAM deposition technique on the patterning resolution, FDTS was inkjet printed on top of the above mentioned substrates: bare glass, ZnO and $MoO_3$ coated substrates. In this case, contact angles of 47°, 42° and 22° were measured for ODCB on the substrates, respectively. Printed FDTS lines resulted in considerably smaller contact angles with respect to the immersed substrates, making module patterning noticeably more difficult. Mainly due to the intrinsic properties of this material, FDTS starts polymerizing within the inkjet printer cartridge. Therefore, the surface of differently processed FDTS films have different adhesion properties.

In the next process, photoactive layers were spray coated on top of FDTS patterned substrates. The topographic evolution of the dried films can be understood by considering the coffee ring effect and the Marangoni flow. The first effect is caused by a faster evaporation rate at the edge of a drying film compared to the inside of the film. Capillary forces compensate for this evaporation, leading to a solution flow from the inside to the edge of the film. The second effect that was considered is the Marangoni flow, which is a solution flow from regions with low surface tension to regions with high surface tension. This can be due to a temperature gradient in the film or a solvent mixture ratio gradient between the edge and the center of the film.

Figure 12:
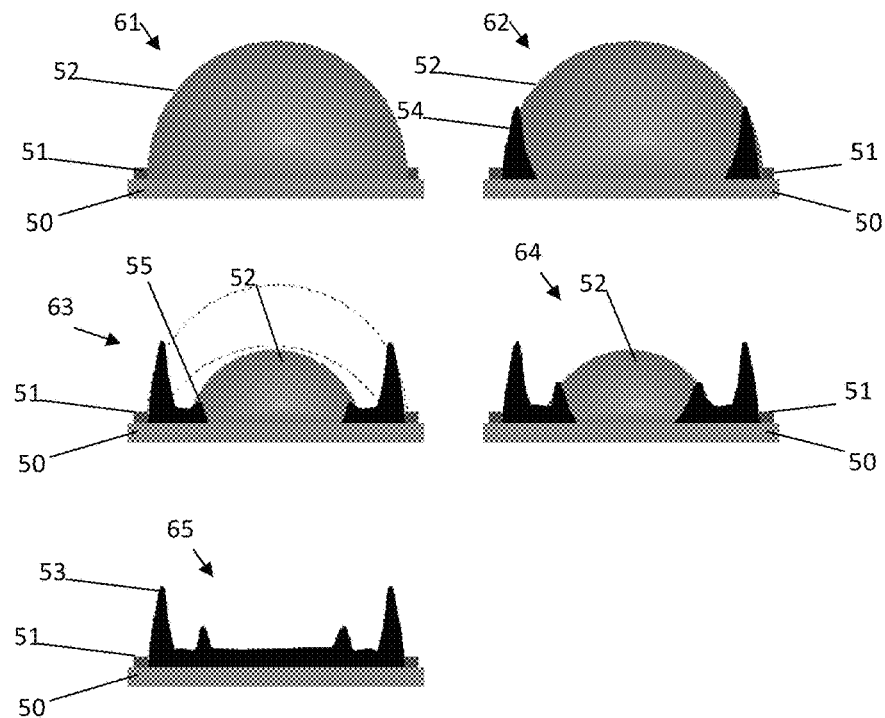
FIG. 12 shows graphical sketches of the drying process of a photoactive layer in a method according to embodiments of the present disclosure.

In all cases, after deposition, the liquid film is pinned between two FDTS lines. When pure ODCB is used as the solvent, Marangoni flows will be present only due to temperature variations in the layer. During evaporation the flow of material will also be dictated by the coffee ring effect from the inside of the film towards the pinned edge, creating an accumulation of material. As the layer volume decreases the contact angle of the pinned solution with the substrate at the FDTS line diminishes until it reaches the receding contact angle of the solvent/substrate interface. At that moment, the contact lines will move inwards, creating the well-known stain effect. However, for certain crystallizing materials, the contact lines can be pinned again (the so called stick-slip effect), forming concentric patterns as it is shown in FIG. 12. FIG. 12 shows graphical sketches of the drying process of the photoactive layer: sketch 61 shows material in liquid phase 52 pinned between two FDTS lines 51 on the substrate 50, sketch 62 shows the accumulation of material at the pinned edges 54 caused by the coffee ring effect, sketch 63 shows secondary pinning 55 of the liquid material known as the stick-slip effect, sketch 64 shows accumulation of material at the edges of the second pinning and sketch 65 shows the profile of the dried layer 53 with two pinning contacts.

Figure 13:
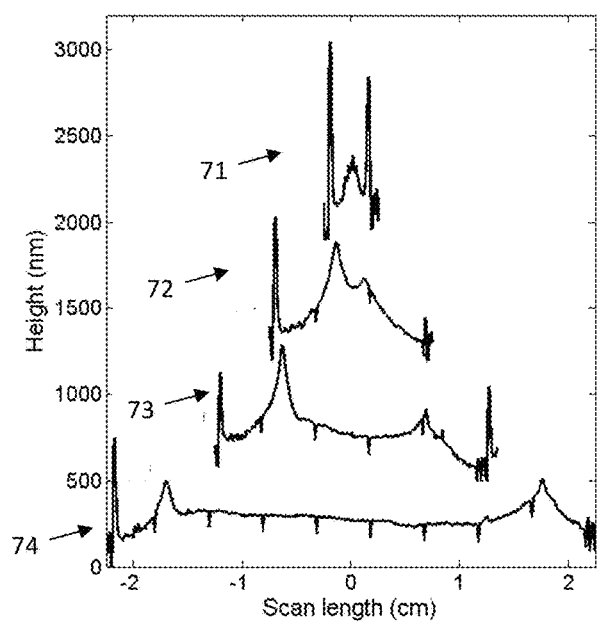
FIG. 13 shows Dektak scan profiles for dried photoactive layers for different spacing between the 1H,1H,2H,2H-Perfluorodecyltrichlorosilane (FDTS) lines, according to embodiments of the present disclosure.

The secondary pinning of the contact line that was observed occurred around 0.5 cm inwards from the initial pinned contact line. This is shown in FIG. 13, which presents Dektak scan profiles for dried photoactive layers for different spacing between the FDTS lines, i.e. for a 0.5 cm spacing in graph 71, 1.5 cm in graph 72, 2.5 cm in graph 73 and 4.5 cm in graph 74. In all the cases the second piling up of the material is around 0.5 cm far from the first pinning position, although this is not shown in FIG. 13 in all cases. Incidentally, in the final module layout (0.5 cm spacing between the FDTS lines), the contact lines move inwards until they would touch each other, so a pile up of material in the middle of the layer can be observed in graph 71. The different film thickness within the ITO contact, between the FDTS lines, implies a non-uniform distribution of photo-generated charges in an OPV cell. Thin areas of the film will not absorb sufficient light to enhance the photocurrent, while other areas can be excessively thick and have a decreased carrier transport and collection.

The semiconductor material peaks at the edge of the film do not deteriorate the conductivity of the top contact. This was tested by depositing a 100 nm thick silver line across a peaked area. The resistance of this line is similar to that of a flat silver contact.

The temperature-driven solvent evaporation rate during the photoactive layer deposition has a similar influence on the dried photoactive film profile. FIG. 14 summarizes the effects of varying solvent mixture and substrate temperature on the dried film profiles. FIG. 14 shows dry active layer profiles for conventional cell architecture on MoO3, in graphs 81 to 84, and for inverted architecture on ZnO, in graph 85. Graph 81 shows a situation where there is lack of secondary solvent (100 vol. % ODCB at 55° C.), graph 82 shows a profile with two pinning contacts (80:20 vol. % ODCB:mesitylene at 55° C.), graph 83 shows a profile with two pinning contacts with a shorter distance between them comparing to case 82 (80:20 vol. % ODCB:mesitylene at 80° C.), graph 84 shows an optimized surface profile for conventional architecture (70:30 vol. % ODCB:mesitylene at 80° C.) and graph 85 shows an optimized surface profile for inverted architecture (70:30 vol. % ODCB:mesitylene at 55° C.). The second pinning is closer to the edges for faster evaporation rates.

Both increasing the amount of mesitylene in the solution (graph 81 vs. graph 82) and increasing the substrate temperature; i.e. speeding up the evaporation rate of the film; (graph 82 vs. graph 83) result in a decreasing distance between the initial and the secondary pinned contact line. After optimization of the mesitylene concentration and the drying temperature of the photoactive layer (30 vol. % mesitylene and 80° C. substrate temperature during spray coating), the ideal situation for standard architecture devices may be achieved (see graph 84). The result is the direct patterning of the active layer, with a resolution of around 400 μm and a uniform profile between FDTS lines for conventional devices, see FIG. 15, which shows a microscope image of patterned lines for a standard architecture device with a resolution of 400 μm.

As discussed hereinabove, the patterning of the module may strongly depend on the layer beneath the FDTS lines. Inverted architectures processed on top of ZnO may demand different deposition conditions than those developed for conventional cell designs, on top of MoO3. Optimized photoactive film profiles may be achieved for the same solvent mixture ratio (70:30 vol. % ODCB:mesitylene) but a lower substrate temperature of 55° C. (see graph 85). These conditions brought the attainable resolution down to 120 μm for inverted structure devices, see FIG. 16, which shows a microscope image of patterned lines for an inverted architecture device with a resolution of 120 μm.

Once the deposition of the photoactive layer was optimized, direct-patterned organic photovoltaic modules were fabricated following the procedure given hereabove. Ten single cells were connected in series over 5.5×5.5 cm² substrates with pre-patterned ITO stripes. Due to the patterned connections between subcells, the total active area of the modules was reduced to 15-20 cm², resulting in a geometrical fill factor between 60-80%.

Figure 17:
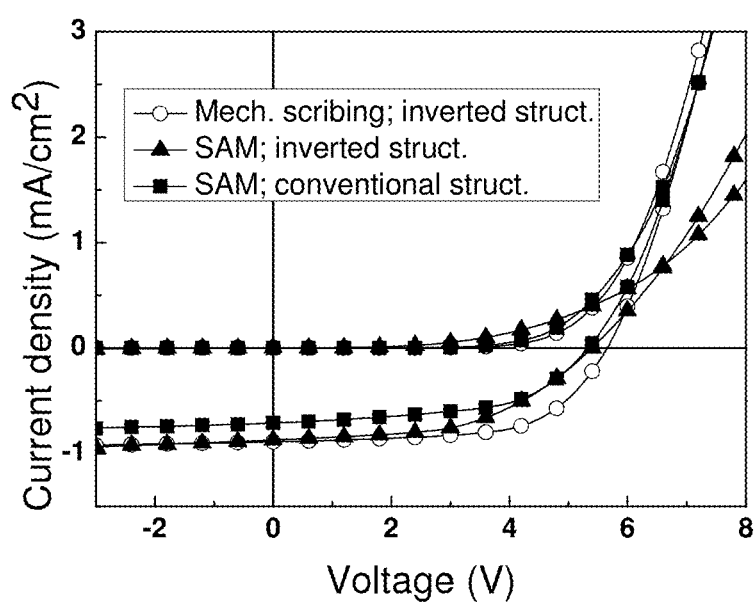
FIG. 17 shows current density vs. voltage (JV) curves under AM1.5G illumination and in the dark, for spray coated organic photovoltaic modules using both standard and inverted cell designs, manufactured according embodiments of the present disclosure.

FIG. 17 and the table here below show current density vs. voltage (JV) curves and photovoltaic performances, respectively, under AM1.5G illumination and in the dark, of the spray coated organic photovoltaic modules using both standard and inverted cell designs. For comparison, the performance of an inverted module where both the photoactive layer as well as the top contact is mechanically scribed is also shown.

| Patterning method | Structure | Active area (cm²) | Photoactive layer thickness (nm) | $J_{sc}$ (mA/cm²) | $V_{oc}$ (V) | FF (%) | $PCE_{active\ area}$ (%) |
|---|---|---|---|---|---|---|---|
| Mech. Scribing | Inverted | 19.88 | 320 | 0.89 | 5.65 | 61.9 | 3.11 |
| SAM | Inverted | 18.60 | 240 | 0.87 | 5.4 | 50.5 | 2.38 |
| SAM | Conventional | 16.52 | 240 | 0.71 | 5.33 | 55 | 2.08 |

The lower fill factor and larger serial resistance noticeable from the JV curves for FDTS patterned modules may be attributed to the somewhat higher electrical resistance of the polymerized FDTS layer between the series connected electrodes of adjacent cells. This may lead to less efficient charge transport and collection mechanisms.

Conventional designs show decreased photocurrent in comparison to inverted designs. This can be explained by the changed optical interference pattern in combination with an increased parasitic absorption of the ytterbium layer used in the cathode. The $V_{oc}$ data reveals that all of the individual cells on the module work as expected, giving additional evidences for the potential of this new patterning technique considering that the modules do not suffer from the typically observed shunts in large area devices. Ultimately, the measured OPV performance demonstrates a very promising low cost patterning method that is fully compatible with roll-to-roll fabrication technologies.

In summary, embodiments of the present disclosure may provide a technology for patterning the photoactive layer of organic polymer:fullerene solar modules that is compatible with roll-to-roll processing, for both conventional and inverted cell designs. For example, a specific surface treatment consisting of the deposition of a fluorinated self-assembled monolayer on top of the bottom electrode prior to the deposition of the photoactive film may be used in a method according to embodiments of the present disclosure. The resolution of the patterning may be around 400 µm for conventional structure and 120 µm for inverted structure devices.

The high electric resistance in the serial connections between the cells, caused by the low conductivity of the FDTS, can be overcome in order to improve the fill factor and therefore the performance of the overall modules. Furthermore, less reactive self-assembled monolayers and materials with a lower polymerization rate may be used to solve the resistivity issue. These materials can also efficiently connect adjacent cells and serve as a direct patterning method for low cost photovoltaic organic modules.

For example, in another aspect, the disclosed technology relates to a semiconductor device comprising a patterned organic semiconductor layer. According to embodiments of the present disclosure, the semiconducting device comprises a substrate comprising a plurality of first electrodes. The semiconductor device also comprises elements of a self-assembling monolayer distributed according a pattern at least at predetermined locations on the first electrodes. Such elements of a self-assembling monolayer may stem from a self-assembling monolayer deposited on top of a charge injection layer, which thus may also be part of the semiconductor device. The elements of the self-assembling monolayer may comprise a solvent repelling material which may be functional groups having a solvent repelling property. The elements of the self-assembling monolayer may be a full self-assembling monolayer. According to embodiments of the present disclosure, the semiconductor device also comprises a patterned organic semiconductor layer, the organic semiconductor layer at least not being present at positions where the elements of the self-assembling monolayer are present. The patterned organic semiconductor layer may be an organic photoactive layer. The patterned organic semiconductor layer may be an electroluminescent layer. The device furthermore may comprise second electrodes. The patterned organic semiconductor layer comprises a plurality of portions arranged for being used in individual photoactive cells. Further feature and advantages may correspond with features and advantages as described with reference to the first aspect. In another aspect, the present disclosure also relates to an organic semiconductor device obtained using a method as described in embodiments of the first aspect.

In yet another aspect, the disclosed technology also relates to an organic photovoltaic module comprising a plurality of monolithically integrated photovoltaic cells. The organic photovoltaic module according to embodiments of the present disclosure comprises a semiconductor device as described above, wherein a patterned organic semiconductor layer of the semiconductor device is an active layer of the plurality of monolithically integrated photovoltaic cells. Further features and advantages may be as expressed with reference to the first and the second aspect.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A method of forming a patterned organic semiconductor layer on a substrate, the method comprising:
   providing a plurality of first electrodes on the substrate;
   providing a patterned self-assembling monolayer at a predetermined location on each of the plurality of first electrodes;
   providing a layer comprising an organic semiconductor material over the patterned self-assembling monolayer; and
   providing a plurality of second electrodes on the layer comprising the organic semiconductor material, wherein each of the second electrodes corresponds to one of the first electrodes,
   wherein providing the plurality of second electrodes forms an electrical contact between one or more of the second electrodes and corresponding one or more of the first electrodes by physical penetration of an electrically conductive material of the corresponding one or more of the second electrodes through the patterned self-assembling monolayer, and
   wherein providing the plurality of second electrodes electrically connects one or more neighboring photovoltaic cells in series.

2. The method according to claim 1, wherein providing the patterned self-assembling monolayer comprises providing a monolayer adapted to locally repel the layer comprising the organic semiconductor material.

3. The method according to claim 2, wherein providing the patterned self-assembling monolayer comprises initially covering regions of the substrate where the layer comprising the organic semiconductor material is not present in a final patterned layer after completion of the method.

4. The method according to claim 2, wherein providing the layer comprising the organic semiconductor material comprises applying the layer comprising the organic semiconductor material entirely over the entire substrate and allowing portions of the layer comprising the organic semiconductor material applied over the patterned self-assembling monolayer to be repelled therefrom, such that the layer comprising the organic semiconductor material is patterned without an additional patterning process.

5. The method according to claim 2, wherein the predetermined location corresponds to a portion of each of the plurality of first electrodes.

6. The method according to claim 2, wherein providing the layer comprising the organic semiconductor material comprises applying a solvent-based organic semiconductor material.

7. The method according to claim 6, wherein providing the patterned self-assembling monolayer comprises providing a monolayer configured to repel a solvent of the solvent-based organic semiconductor material.

8. The method according to claim 7, wherein providing the layer comprising the organic semiconductor material further comprises performing a drying process for evaporating the solvent from the solvent-based organic semiconductor material.

9. The method according to claim 1, further comprising providing a charge injection layer on at least the plurality of first electrodes before providing the patterned self-assembling monolayer.

10. The method according to claim 9, further comprising performing a heat treatment for inducing a reaction between the self-assembling monolayer and at least one of the plurality of first electrodes and the charge injection layer.

11. The method according to claim 1, wherein providing the patterned self-assembling monolayer at the predetermined locations comprises ink-based printing.

12. The method according to claim 2, wherein the predetermined locations are configured for defining a plurality of photoactive cells of an organic photovoltaic module or an array to be formed on the substrate.

13. The method according to claim 2, wherein the predetermined locations are configured for defining a plurality of organic light emitting diodes (OLED) of an OLED array to be formed on the substrate.

14. The method according to claim 2, wherein providing the layer comprising the organic semiconductor material comprises providing a layer comprising an organic electroluminescent material.

15. The method according to claim 1, wherein providing the patterned self-assembling monolayer comprises forming the self-assembling monolayer only at the predetermined location on each of the plurality of first electrodes.

16. The method according to claim 1, wherein providing the patterned self-assembling monolayer comprises removing portions of the self-assembling monolayer after providing the patterned self-assembling layer.

17. The method according to claim 1, wherein the method comprises forming a plurality of photovoltaic cells, and wherein forming the electrical contact between the one or more of the second electrodes and the corresponding one or more of the first electrodes comprises electrically connecting neighboring ones of the plurality of photovoltaic cells.

18. The method according to claim 1, wherein upon providing the layer comprising the organic semiconductor material, the layer comprising the organic semiconductor material is repelled from the predetermined locations covered with the patterned self-assembling monolayer while remaining in areas outside of the predetermined locations, such that the patterned organic semiconductor layer is formed, wherein the patterned organic semiconductor layer defines a plurality of photovoltaic cells of an organic photovoltaic module.

* * * * *

UNITED STATES PATENT AND TRADEMARK OFFICE
CERTIFICATE OF CORRECTION

PATENT NO. : 10,468,599 B2
APPLICATION NO. : 14/328084
DATED : November 5, 2019
INVENTOR(S) : David Cheyns Page 1 of 1

It is certified that error appears in the above-identified patent and that said Letters Patent is hereby corrected as shown below:

In the Specification

In Column 5, Line 34, delete "dissulfides" and insert --disulfides--.

In Column 12, Line 13, delete "dissulfides" and insert --disulfides--.

In Column 14, Line 18, delete "(mesytylene)." and insert --(mesitylene).--.

In the Claims

In Column 20, Line 62, Claim 4, after "the" delete "entire".

Signed and Sealed this
Third Day of March, 2020

Andrei Iancu
*Director of the United States Patent and Trademark Office*